United States Patent
Bratkovski et al.

(10) Patent No.: US 7,720,342 B2
(45) Date of Patent: May 18, 2010

(54) OPTICAL DEVICE WITH A GRADED BANDGAP STRUCTURE AND METHODS OF MAKING AND USING THE SAME

(75) Inventors: Alexandre Bratkovski, Mountain View, CA (US); Theodore I. Kamins, Palo Alto, CA (US); David Fattal, Mountain View, CA (US); Raymond Beausoleil, Redmond, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/262,394

(22) Filed: Oct. 31, 2008

(65) Prior Publication Data

US 2009/0257703 A1    Oct. 15, 2009

Related U.S. Application Data

(60) Provisional application No. 61/045,259, filed on Apr. 15, 2008.

(51) Int. Cl.
*G02B 6/036* (2006.01)
*H01L 31/107* (2006.01)
(52) U.S. Cl. .................................. 385/129; 257/186
(58) Field of Classification Search ......... 385/129–132; 257/186–188
See application file for complete search history.

(56) References Cited

U.S. PATENT DOCUMENTS

| | | | |
|---|---|---|---|
| 5,476,811 A | 12/1995 | Fujii et al. | |
| 5,682,455 A | 10/1997 | Kovacic | |
| 6,403,975 B1 | 6/2002 | Brunner | |
| 6,690,871 B2 | 2/2004 | Lee | |
| 6,803,557 B1 * | 10/2004 | Taylor et al. | 250/214.1 |
| 6,978,067 B2 | 12/2005 | Herbert | |
| 7,133,577 B1 | 11/2006 | Bratkovski | |
| 7,161,170 B1 * | 1/2007 | Yoder | 257/21 |
| 7,186,582 B2 | 3/2007 | Todd | |
| 7,217,982 B2 * | 5/2007 | Taylor et al. | 257/442 |
| 7,557,387 B2 * | 7/2009 | Ishibashi et al. | 257/186 |
| 2002/0021879 A1 | 2/2002 | Lee | |
| 2005/0141801 A1 | 6/2005 | Gardner | |
| 2006/0207644 A1 * | 9/2006 | Robinson et al. | 136/243 |
| 2007/0104441 A1 | 5/2007 | Ahn | |
| 2007/0189688 A1 | 8/2007 | Dehlinger | |

* cited by examiner

*Primary Examiner*—Kevin S Wood (57) ABSTRACT

An optical device includes at least two materials forming a structure with a graded bandgap where photocarriers are generated. A first of the at least two materials has a larger concentration at opposed ends of the graded bandgap structure than a concentration of the first of the at least two materials at an interior region of the graded bandgap structure. The second of the at least two materials has a larger concentration at the interior region of the graded bandgap structure than the concentration of the second of the at least two materials at the opposed ends of the graded bandgap structure.

24 Claims, 5 Drawing Sheets

OPTICAL DEVICE WITH A GRADED BANDGAP STRUCTURE AND METHODS OF MAKING AND USING THE SAME

CROSS-REFERENCE TO RELATED APPLICATION

The present application claims priority from provisional application Ser. No. 61/045,259, filed Apr. 15, 2008, the contents of which are incorporated herein by reference in their entirety.

BACKGROUND

The present disclosure relates generally to optical devices with a graded bandgap structure and methods of making and using the same.

Since the inception of microelectronics, a consistent trend has been toward the development of optoelectronic circuits, such as optical interconnects. This may be due, at least in part, to the fact that optoelectronic circuits may offer advantages over typical electronic circuits, such as, for example, a much larger bandwidth (by many orders of magnitude). Such optoelectronic circuits often involve the transmission of optical signals, and the interconversion of such optical signals into electronic signals. In some instances, performing optical signal transmission and conversion involves a photodetector device that is compatible with both the bandwidth and the speed of the optical signal. Many photodetectors are based on and/or involve semiconductor technology, including compound semiconductors (GaAs, InP, GaInAsP, etc.), bulk silicon, silicon-on-insulator (SOI) technology, and CMOS technology.

BRIEF DESCRIPTION OF THE DRAWINGS

Features and advantages of embodiments of the present disclosure will become apparent by reference to the following detailed description and drawings, in which like reference numerals correspond to the same or similar, though perhaps not identical, components. For the sake of brevity, reference numerals having a previously described function may or may not be described in connection with subsequent drawings in which they appear.

DETAILED DESCRIPTION

Embodiments of the optical device disclosed herein advantageously include a graded bandgap structure. The engineering of the graded bandgap structure may be configured such that electron/hole pairs are generated at a particular region of the structure and are extracted relatively rapidly from the graded bandgap structure. Non-limiting examples of such optical devices include photodetectors and modulators. Such optical devices may advantageously be integrated with, for example, a waveguide or a resonator.

Figure 1:
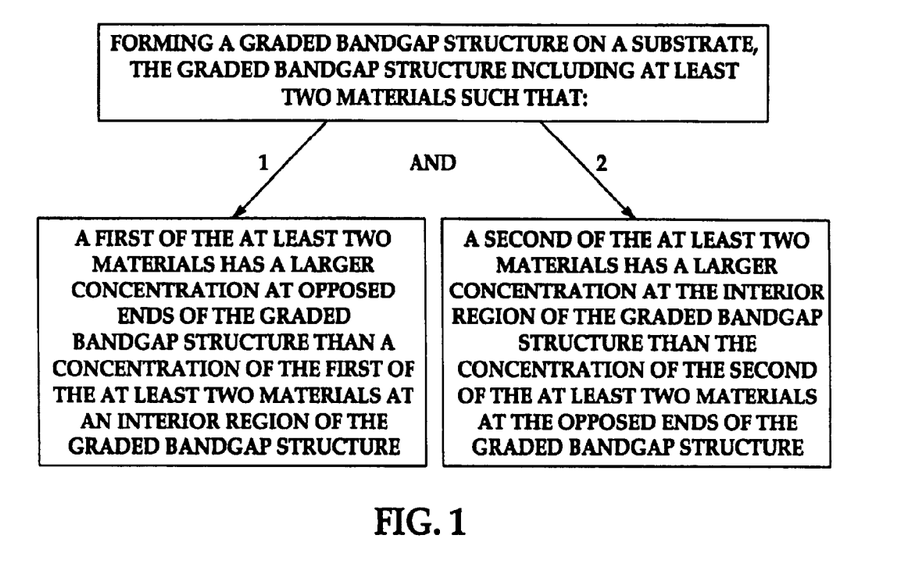
FIG. 1 is a flow diagram depicting an embodiment of a method of making an embodiment of an optical device.

FIG. 1 depicts an embodiment of a method for making an embodiment of an optical device. Generally, the method includes forming a graded bandgap structure on a substrate. The graded bandgap structure includes at least two materials such that 1) a first of the at least two materials has a larger concentration at opposed ends of the graded bandgap structure than a concentration of the first of the at least two materials at an interior region of the graded bandgap structure; and 2) a second of the at least two materials has a larger concentration at the interior region of the graded bandgap structure than the concentration of the second of the at least two materials at the opposed ends of the graded bandgap structure. It is to be understood that embodiments of the method will be further discussed in reference to the remaining Figures.

Figure 2A:
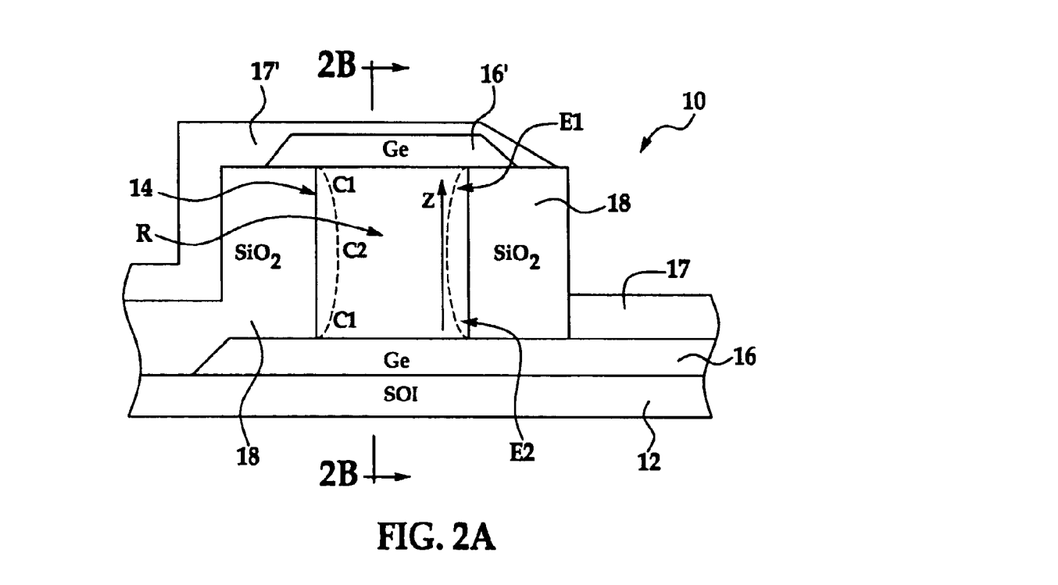
FIG. 2A is a schematic view of an embodiment of an optical device.

Referring now to FIG. 2A, an embodiment of the optical device 10 is depicted. The optical device 10 generally includes a substrate 12 and a graded bandgap structure 14 established on the substrate 12. The optical device 10 may also include an insulating material 18 adjacent the graded bandgap structure 14.

Figure 2B:
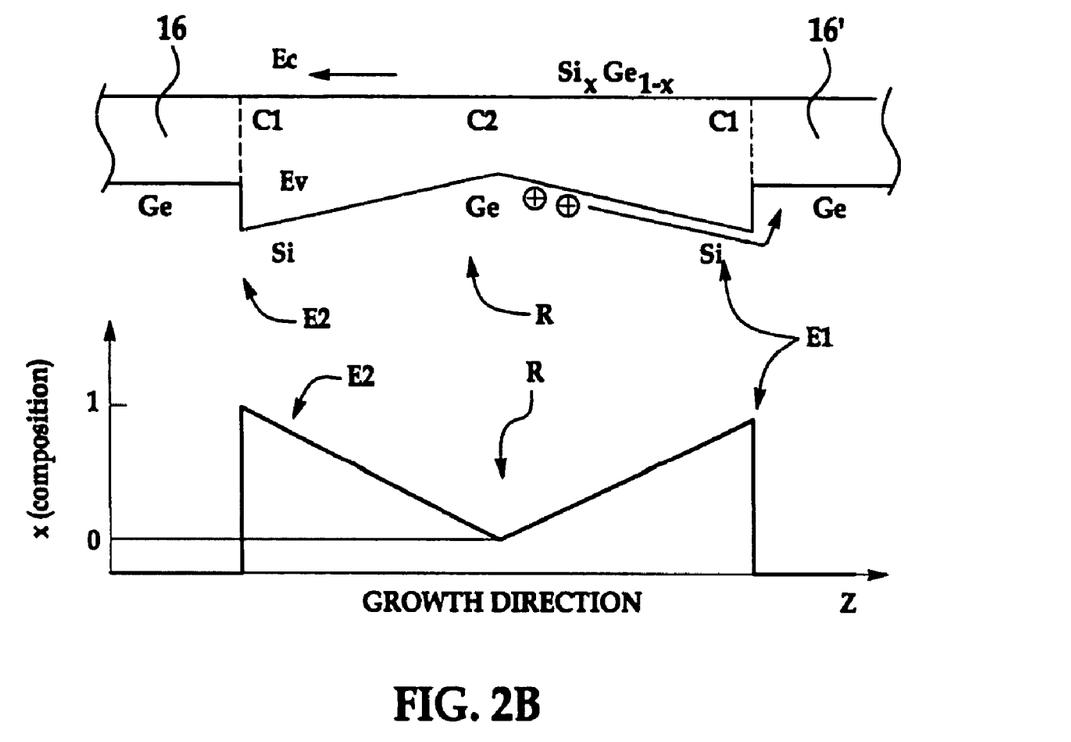
FIG. 2B includes a cross-sectional view taken along line 2B-2B of FIG. 2A and rotated 90°, where the graded bandgap structure is formed of silicon and germanium, and a graph depicting the change in the bandgap along the growth direction as the value of "x" in the composition $Si_xGe_{1-x}$ changes.

While FIG. 2A illustrates a general embodiment of the structure 14, FIG. 2B illustrates an example in which silicon and germanium is used to form the graded bandgap structure 14.

As shown in FIG. 2A, a non-limiting example of a suitable substrate 12 material includes a silicon-on-insulator substrate (which includes a top silicon layer and an intermediate oxide layer established on a silicon wafer) operatively connected to germanium or silicon electrodes 16, 16' (shown as Ge electrodes in FIGS. 2A and 2B) for carrier extraction. It is to be understood that other electrodes 17, 17' may also be operatively connected for carrier extraction. The germanium or silicon electrodes 16, 16' are also referred to herein as contact regions. Other non-limiting examples of substrate 12 materials include silicon, gallium arsenide, or germanium-on-insulator wafers. In some instances, the substrate 12 may be formed of an insulating material (e.g., silicon dioxide, silicon nitride, etc.).

It is to be understood that the substrate 12 or electrodes 16, 17 established thereon is/are conducting such that it/they is/are able to collect carriers generated within the bandgap structure 14. The electrode 16 is particularly desirable if the substrate 12 is formed of an insulating material. As such, in some instances, the electrode 16 is established between the substrate 12 and the graded bandgap structure 14.

It is to be understood that metallic contact may be made to the side of the substrate 12 if it is conducting, to the side of the electrodes 16, 17 if the substrate 12 is insulating or contains an insulating layer, or at the back of the substrate 12 if it is conducting and no insulating layer is included. It is to be understood that the geometry of the contact layers should be such that they do not overlap significantly with the optical mode.

One of the germanium or silicon electrodes 16' and one of the other electrodes 17' in the optical device 10 shown in FIG. 2A are established on the structure 14 opposed to the substrate 12 and/or the electrodes 16, 17. The electrodes 16', 17' may also extend beyond the edges of the structure 14 onto an adjacent insulating material 18. Metallic contact may be made at any suitable position on the electrode 16', 17' (e.g., to the extension regions of electrode 17' positioned on the adjacent insulating material 18).

As previously mentioned, the electrodes 16, 16' shown in FIG. 2A are formed of germanium, but may, in some instances be formed of silicon. The material for the electrode 16, 16' is selected, in part, based on whether it is desirable to have a barrier for holes between the graded (structure 14) and ungraded (electrode 16, 16') regions.

The other electrodes 17, 17' may be formed of a conductor material, a semiconductor material, or a compound semiconductor material. Non-limiting examples of suitable materials for the other electrodes 17, 17' include silicon, germanium, alloys of silicon and germanium, gallium arsenide, gallium aluminum arsenide, poly silicon, or combinations thereof. Any of the electrodes 16, 16', 17, 17' may be established via any suitable deposition technique, including, but not limited to wafer bonding and thinning or cleaving, or chemical vapor deposition (CVD).

The dashed lines on the left side of the optical device 10 in FIG. 2A schematically illustrate the variation in the conduction band minimum across the structure 14, and the dashed lines on the right side of the optical device in FIG. 2A schematically illustrate the variation in the valence band maximum across the structure 14. It is to be understood that the dashed lines shown in FIG. 2A generally illustrate variations in conduction band minimum and valence band maximum. The conduction and valence bands may be altered depending, at least in part, on the materials used in the structure 14. As a non-limiting example, the left dashed line (corresponding to the conduction band) is a substantially straight line when silicon and germanium are used in the structure 14.

The graded bandgap structure 14 includes at least two materials that are established such that different compositions $C_1$, $C_2$ of the materials are present in the structure 14. The growth of the structure 14 generally takes place in the Z direction, as depicted in FIG. 2A. The materials are established such that the second material has a larger concentration at an interior region R than its concentration at the opposed ends E1, E2, and the first material has a larger concentration at the opposed ends E1, E2 than its concentration at the interior region R. It is to be understood that the composition $C_1$ at one of the opposed ends E1 may be the same or different than the composition $C_1$ at the other of the opposed ends E2.

The first material is an element (e.g., Si) or a compound semiconductor, and the second material is another element (e.g., Ge) or a compound semiconductor. The first and second materials may also be alloys. In an embodiment, composition $C_1$ may be made up entirely of the first material or is an alloy of the first and second materials, and composition $C_2$ is made up entirely of the second material or is an alloy of the first and second materials that has less of the first material than does the composition $C_1$. As such, composition $C_1$ and/or $C_2$ may contain less than 100% of the first material or the second material.

The concentration of the materials is varied throughout all or a portion of the structure 14 from the opposed ends E1, E2 towards an interior region R. Generally, as the interior region R is approached, the concentration of the first material becomes less than the concentration of the first material at the opposed ends E1, E2. In some instances, the composition $C_1$ is about 100% of the first material at the two opposed ends E1, E2, the composition $C_2$ is about 100% of the second material at the interior region R, and the concentration of the materials between the respective ends E1, E2 and the interior region R is some desirable combination of the materials. In other instances, the composition $C_1$ is 100% of the first material (e.g., Si), composition $C_2$ is an alloy of the first and second materials (for example, $Si_xGe_{1-x}$), and the graded region is an alloy of the first and second materials, e.g., $Si_{(y)}Ge_{(1-y)}$, where "y" is a function of distance and where y<x. It is to be understood that any suitable combination of the materials may be used between the respective ends E1, E2 and the interior region R. Generally, the composition may be varied to vary the potential well profile for carriers, which in turn will affect the spread of the photogenerated carriers in the graded structure 14 and the extraction time.

In still another non-limiting example, at the opposed end E1, 100% of the first material may be present, then the composition of the structure 14 gradually changes such that about 70% of the first material and about 30% of the second material is present, then the composition continues to gradually change such that about 30% of the first material and about 70% of the second material is present, and finally the composition is 100% of the second material at the interior region R. In some instances, the gradients between the respective ends E1, E2 and the interior region R will be mirror images (symmetrical), and in other instances, the gradients between the respective ends E1, E2 and the interior region will be different (asymmetrical).

The graded bandgap structure 14 is an active (detector) area where photocarriers are generated and from which photocarriers are extracted. As a non-limiting example, the active area (graded bandgap structure 14) is formed of $Si_xGe_{1-x}$, where x varies along the growth direction from x=1 to x=0 towards the interior region R of the structure 14, then from x=0 to x=1 towards one opposed end E1 of the structure 14 (see FIG. 2B). It is to be understood that "x" may be the same or different at the opposed ends E1, E2. In one embodiment, Ge electrodes 16, 16' adjacent the opposed ends E1, E2 are used to create a potential barrier, which will prevent the extracted holes from moving back into the detector area (see FIG. 2B). This may be advantageous in preventing the scattering of light that travels through the active area, for example, if the optical device 10 is used as a part of a waveguide.

In the structure 14 shown in FIG. 2A, the grading forms a potential well for holes inside the undoped $Ge/Si_xGe_{1-x}/Ge$ structure (see FIG. 2B). The holes may be quickly extracted by biasing the structure 14. It is to be understood that p-i-n diodes with the same motif may be formed, and are discussed further hereinbelow in reference to FIGS. 3A, 3B, 4A and 4B.

It is to be understood that the interior region R may be located at the geometric center of the structure 14 (as shown in FIGS. 2A and 2B), or it may be offset from the geometric center of the structure 14. This enables the region where photocarriers are generated most effectively by light of a given wavelength to be placed at the center of the optical path or at some other desirable position. The positioning of the interior region R may also affect the variations of fields that collect photogenerated carriers, and thus the speed of the optical device 10. Still further, the positioning of the interior region R may affect the collection efficiency.

In some instances, the composition $C_2$ has a smaller bandgap than the bandgap of the composition $C_1$. In such instances, the second material has a smaller bandgap than the bandgap of the first material (i.e., the material having the higher concentration in composition $C_1$ at the opposed ends E1, E2). The smaller bandgap of the second material enables the second material to absorb longer wavelengths and/or a wider range of wavelengths than the first material. In other instances, it may be desirable for the composition $C_1$ to have a smaller bandgap than the bandgap of the composition $C_2$. It is to be understood that the rates of generation and extraction may be varied, depending, at least in part, on the materials selected, the compositions $C_1$, $C_2$ selected for the various areas E1, E2, R of the structure 14, the spatial variation of the compositions $C_1$, $C_2$ in the structure 14, and the resulting configuration of the formed potential profile.

Based on the properties of the respective materials and the compositions $C_1$, $C_2$ in which they are included, it is to be understood that a bandgap of the structure 14 may increase as the concentration of the first material increases, and vice versa. The energy-band structure shown in FIG. 2B illustrates a smaller bandgap near the interior region R and a larger bandgap at each of the opposed ends E1, E2.

Non-limiting examples of suitable first materials include silicon, $Al_{1-x}Ga_xAs$ (e.g., $In_{0.53}Ga_{0.47}As$) or $InAs_{1-x}P_x$ (e.g., $In_{0.7}Ga_{0.3}As_{0.64}P_{0.36}$), where x ranges from 0 to 1. Further, examples of suitable second materials include, but are not limited to, germanium, GaAs, InAs, or $Si_xGe_{1-x}$, where x ranges from 0 to 1. It is to be understood that the compositions $C_1$, $C_2$ of the material(s) are not the same, and as such, "x" is selected such that $C_1$ does not equal $C_2$. For example, if the first material is silicon and the composition $C_1$ is 100% of the first material, the second material may be $Si_xGe_{1-x}$ where x is greater than 0. It is to be further understood that these examples are non-limiting, and that any desirable materials may be selected as long as the composition $C_2$ has a smaller bandgap than the bandgap of the composition $C_1$.

Figure 3A:
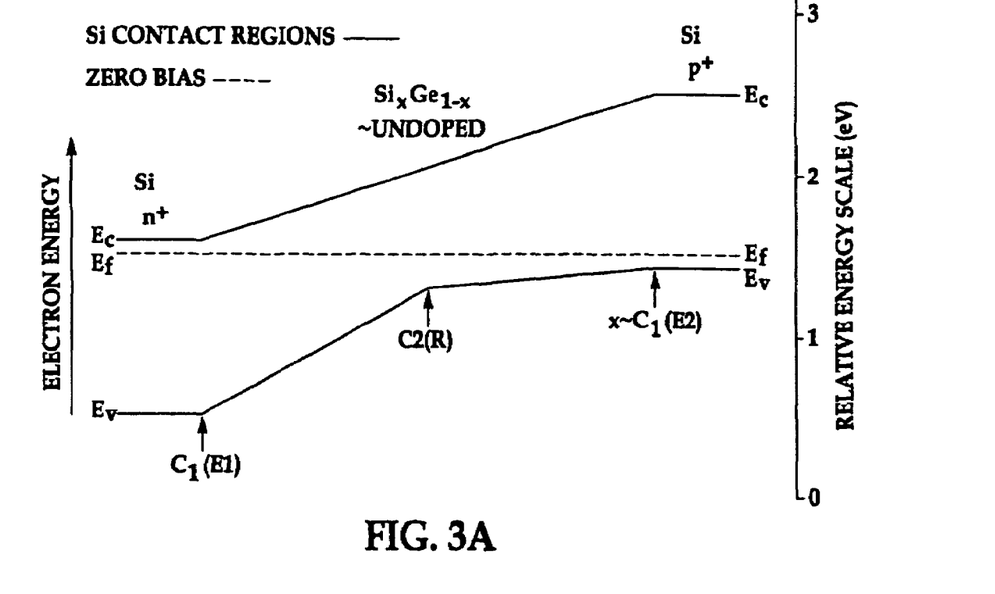
FIG. 3A is an energy band diagram for a Si-Ge p-i-n diode structure having a graded bandgap and Si contact regions.
Figure 3B:
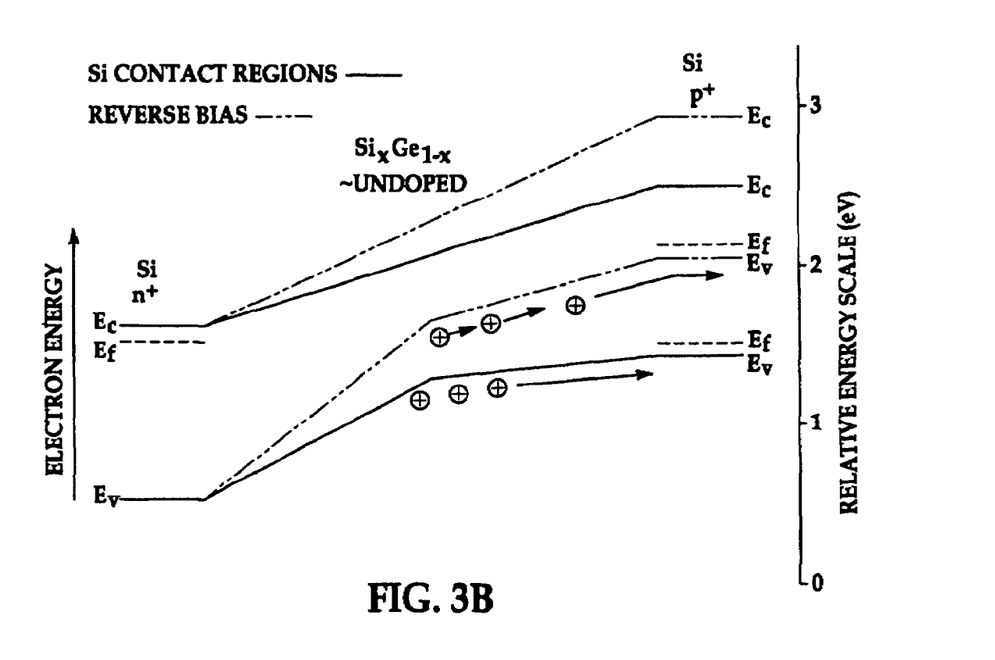
FIG. 3B is an energy band diagram for the Si-Ge p-i-n diode structure of FIG. 3A under reverse bias.
Figure 4A:
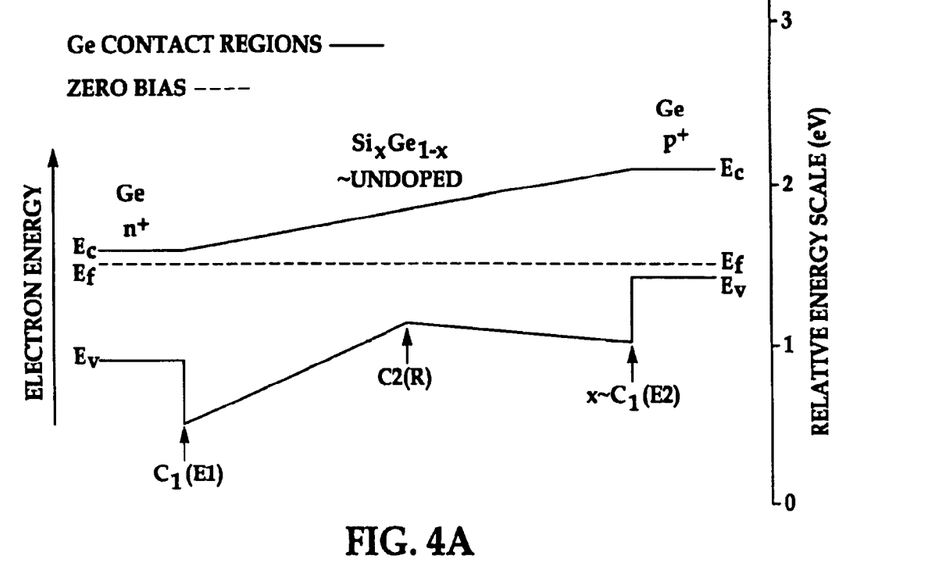
FIG. 4A is an energy band diagram for a Si-Ge p-i-n diode structure having a graded bandgap and Ge contact regions.
Figure 4B:
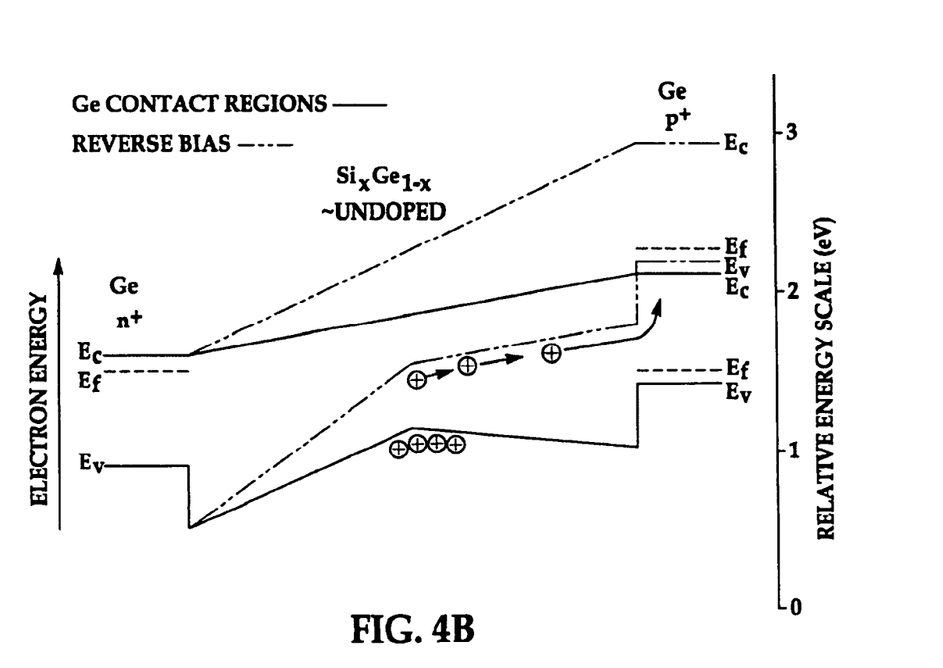
FIG. 4B is an energy band diagram for the Si-Ge p-i-n diode structure of FIG. 4A under reverse bias.

The graded bandgap structure 14 may have ungraded (contact) regions on one or both sides of the graded region. A non-limiting example of such contact regions are the electrodes 16, 16' shown in FIG. 2A. The ungraded region may be composed of composition $C_1$ (e.g., Si), as shown in FIGS. 3A and 3B, for zero bias and a reverse bias, respectively (shown for materials with no substantial conduction-band discontinuity, such as Si and Ge). When the ungraded region is composed of composition $C_1$, there is no barrier for electrons or for holes between the graded and ungraded regions. Alternatively, the ungraded region may be composed of a different composition than composition $C_1$ (e.g., Ge) and have a smaller bandgap, as shown in FIGS. 4A and 4B for zero bias and for a reverse bias, respectively (shown for materials with no substantial conduction-band discontinuity). When the band discontinuity is in the valence band, the barrier prevents holes from traveling from the ungraded region into the graded region (i.e., graded bandgap structure 14) where they would be able to accumulate and change the optical properties of the optical device 10. When the materials are selected so that there are barriers in both the conduction band and the valence band between the graded and ungraded regions, both holes and electrons will be blocked from traveling from the ungraded regions into the graded region.

Referring more specifically to FIGS. 3A and 3B, energy band diagrams for a p-i-n diode including a $Si/Si_xGe_{1-x}/Si$ graded bandgap structure 14 and silicon contact regions are depicted. FIG. 3A depicts the energy band diagram of a p-i-n diode photodetector without the potential barrier for holes at the $Si/Si_xGe_{1-x}$ interface. A built-in field will separate electrons from holes, with the photogenerated charge flowing through the external circuit (i.e., electrodes 16, 16', 17, 17'). The flow of charge is an indication that the light is detected. The speed of extraction may be increased by biasing the structure 14 to remove the carriers (see FIG. 3B).

It is to be understood that the optical device 10 may be used as an injection modulator, where modulation of light going through the active area in a waveguide is accomplished via the injected carriers. Modulation may involve absorbing the injected carriers. In some instances, biasing is more suitable for modulation than for detection.

Referring more specifically now to FIGS. 4A and 4B, energy band diagrams for a p-i-n diode including a $Ge/Si_xGe_{1-x}/Ge$ graded bandgap structure 14 are depicted. In such a system, holes encounter a potential barrier at the interface of the materials, as depicted in FIG. 4A. By selecting the composition in the interior region R of the graded bandgap structure 14, a potential profile for holes with or without a potential well may be formed. Without a potential well, the p-i-n structure will function as a photodetector where the removed carriers cannot return back into the active area. If there is a potential well, a small bias is used to extract the holes quickly (shown in FIG. 4B).

Figure 5:
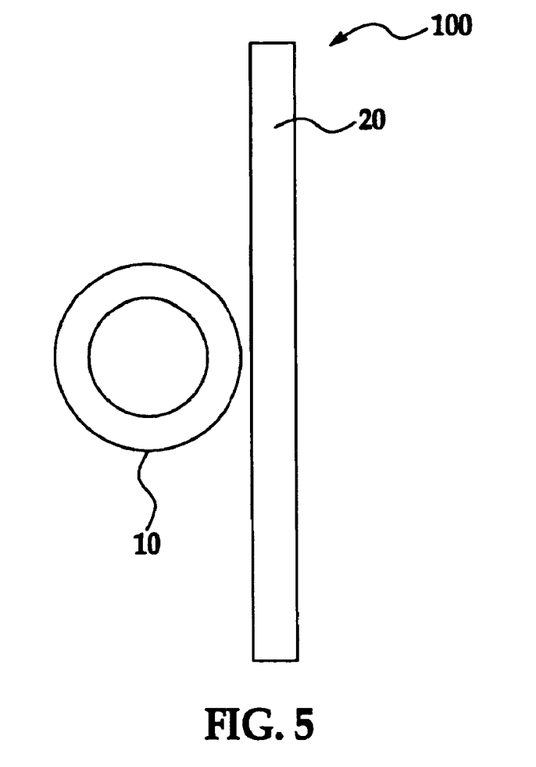
FIG. 5 is a schematic top view of a ring resonator and a waveguide.

The detector or modulator disclosed herein may be used as a section of, e.g., a ring modulator or a Mach-Zehnder modulator. As shown in FIG. 5, in one embodiment, the optical device 10 is incorporated in an optical device 100 in the form of a ring resonator structure 10. In such an embodiment, the dimensions of the waveguide 20 and the physical gap between the ring 10 and the waveguide 20 may be adjusted to obtain "critical coupling", a regime under which the waveguide 20 is optically impedance-matched to the ring 10 and where nearly 100% of the incident light signal is transferred to the ring 10 where it will be absorbed. Critical coupling is obtained when the rate of energy transfer between the ring 10 and the waveguide 20 equals the rate of energy absorption and/or dissipation in the ring 10 itself. The required geometry depends, at least in part, on the effective absorption coefficient of light in the ring 10, and therefore on the choice of materials, the composition $C_1$, $C_2$, and the grading profile.

The ring 10 is generally critically coupled for a single frequency channel propagating down the waveguide 20. Other frequency channels pass by this ring 10. One substantial advantage of this approach is that the channel drop and the photodetection functions are combined into a single device.

Figure 6A:
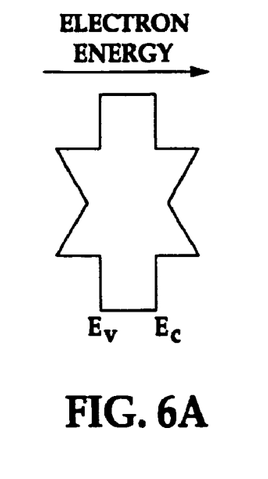
FIG. 6A is a schematic diagram depicting an embodiment of a bandgap profile.
Figure 6B:
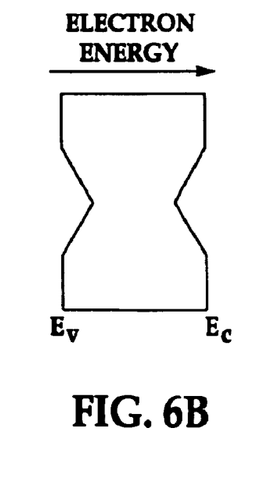
FIG. 6B is a schematic diagram depicting another embodiment of a bandgap profile.

It is to be understood that different materials may be used to form the graded bandgap structure 14 and the electrodes 16, 16', 17, 17', and thus different profiles for the carriers may be formed, as shown in FIGS. 6A and 6B. Generally, the profiles shown in FIGS. 6A and 6B may be produced using materials other than silicon and germanium, and such devices would not generally be compatible with CMOS technology. FIG. 6A shows an energy band diagram with conduction- and valence-band barriers to the ungraded regions, and FIG. 6B shows an energy band diagram with the ungraded regions having the same composition as $C_1$ so that there are no barriers to carrier injection into the graded bandgap structure 14. In the structure that corresponds with the energy band diagram of FIG. 6B, carriers accumulating in the graded region can modify the optical behavior of the ring resonator. In some instances, such as in photodetectors, such modification can degrade the optical properties of the ring resonator; for example, by changing the optical path length so that the resonant frequency changes. In other instances, such as in optical modulators, such modification may be advantageous.

A method for making the optical device 10 includes forming the graded bandgap structure 14 on the substrate 12 or on electrode 16. The graded bandgap structure 14 may be established by depositing the desirable material(s) to form the desirable compositions $C_1$, $C_2$ via chemical vapor deposition (CVD), molecular-beam epitaxy (MBE), any other suitable epitaxial layer formation technique, or any other suitable deposition technique. Forming the gradient of the material(s) may be accomplished by varying a concentration of one or more gaseous precursors or arriving species during deposition. For example, the concentration of the gaseous precursor or arriving species of the first material may be increased when forming the composition $C_1$ at one of the opposed ends E1, E2 of the structure 14, and the concentration of the gaseous precursor or arriving species of the second material may be increased when forming the interior region R of the structure 14. For example, when the first and second materials are silicon and germanium, respectively, and the structure 14 is formed via chemical vapor deposition, the ratio of the silicon-containing gas, such as silane or dichlorosilane, to the germanium-containing gas, such as germane, is reduced as the structure 14 is deposited moving from opposed end E2 to interior region R. When forming the gradient, it is to be understood that (in some instances) the bandgap is decreased when the concentration of the first material is decreased and the concentration of the second material is increased (i.e., when transitioning from the composition $C_1$ to composition $C_2$).

In an embodiment of using the optical device 10, light beams of a predetermined wavelength or range of wavelengths are directed toward the graded bandgap structure 14. As a result of such exposure, electron-hole pairs are generated in the graded bandgap structure 14. The increased concentration of the second material at the interior region R advantageously enables the generation of electron-hole pairs by longer-wavelength radiation. It is to be understood that the rate of extraction will depend, at least in part, on the composition $C_2$, as well as the applied electric field. The presence of the light beams is monitored by collecting the photogenerated carriers in an external circuit (e.g., integrated or separate measurement circuitry and the previously described electrodes 16, 16' and contacts) that is operatively connected to the graded bandgap structure.

While several embodiments have been described in detail, it will be apparent to those skilled in the art that the disclosed embodiments may be modified. Therefore, the foregoing description is to be considered exemplary rather than limiting.

What is claimed is:

1. An optical device, comprising:
   at least two materials forming a structure with a graded bandgap where photocarriers are generated;
   a first of the at least two materials having a larger concentration at opposed ends of the graded bandgap structure than a concentration of the first of the at least two materials at an interior region of the graded bandgap structure; and
   a second of the at least two materials having a larger concentration at the interior region of the graded bandgap structure than the concentration of the second of the at least two materials at the opposed ends of the graded bandgap structure.

2. The optical device as defined in claim 1, further comprising respective electrodes operatively connected to the opposed ends, the respective electrodes having a narrower bandgap than a bandgap at the opposed ends, thereby creating a potential barrier for extracted photocarriers.

3. The optical device as defined in claim 1 wherein the second of the at least two materials is a material capable of absorbing wavelengths that are longer than wavelengths that are capable of being absorbed by the first of the at least two materials.

4. The optical device as defined in claim 1 wherein the second of the at least two materials is a material capable of absorbing a wider range of wavelengths than the first of the at least two materials.

5. The optical device as defined in claim 1 wherein a composition of the first and second materials at the interior region has a bandgap that is smaller than a bandgap of a composition of the first and second materials at the opposed ends.

6. The optical device as defined in claim 1 wherein a bandgap of the graded bandgap structure increases as the concentration of the first of the at least two materials increases.

7. The optical device as defined in claim 1 wherein the first of the at least two materials is selected from silicon, $Al_{1-x}Ga_xAs$, and $InAs_{1-x}P_x$, where x ranges from 0 to 1.

8. The optical device as defined in claim 1 wherein the second of the at least two materials is selected from germanium, GaAs, InAs, and $Si_xGe_{1-x}$, where x ranges from 0 to 1.

9. The optical device as defined in claim 1, further comprising a substrate upon which the graded bandgap structure is established.

10. The optical device as defined in claim 9, further comprising an electrode established between the substrate and the graded bandgap structure.

11. The optical device as defined in claim 10 wherein the substrate is a silicon-on-insulator substrate including a silicon layer and an insulating layer established on a silicon wafer.

12. The optical device as defined in claim 11 wherein the insulating layer is selected from silicon dioxide and silicon nitride.

13. The optical device as defined in claim 10 wherein the substrate is selected from silicon and gallium arsenide.

14. The optical device as defined in claim 1 wherein the optical device is integrated into a waveguide or a resonator.

15. The optical device as defined in claim 1 wherein the optical device is selected from the group consisting of photodetectors and modulators.

16. A method of using the optical device of claim 1, comprising:
    directing one or more light beams of a predetermined wavelength or range of wavelengths toward the graded bandgap structure, thereby generating electron-hole pairs in the graded bandgap structure; and
    monitoring a presence of the one or more light beams in the optical device.

17. The method as defined in claim 16 wherein monitoring is accomplished by collecting photogenerated carriers in an external circuit operatively connected to the graded bandgap structure.

18. A method of making an optical device, the method comprising:
    forming a graded bandgap structure on a substrate, the graded bandgap structure including at least two materials such that:
    a first of the at least two materials has a larger concentration at opposed ends of the graded bandgap structure than a concentration of the first of the at least two materials at an interior region of the graded bandgap structure; and
    a second of the at least two materials has a larger concentration at the interior region of the graded bandgap structure than the concentration of the second of the at least two materials at the opposed ends of the graded bandgap structure.

19. The method as defined in claim 18, further comprising establishing a conducting layer on the substrate prior to forming the graded bandgap structure.

20. The method as defined in claim 18, further comprising operatively connecting respective electrodes to the opposed ends, the respective electrodes having a narrower bandgap than a bandgap at the opposed ends, thereby creating a potential barrier for extracted photocarriers.

21. The method as defined in claim 18 wherein forming the graded bandgap structure is accomplished via chemical vapor deposition or molecular beam epitaxy.

22. The method as defined in claim 21 wherein forming the graded bandgap structure is accomplished by varying a concentration of gaseous precursors during chemical vapor deposition.

23. The method as defined in claim 21 wherein forming the graded bandgap structure is accomplished by varying a concentration of an arriving species during molecular beam epitaxy.

24. The method as defined in claim 18 wherein forming the graded bandgap structure includes increasing the bandgap by increasing the concentration of the first of the at least two materials.

\* \* \* \* \*